United States Patent [19]

Betts et al.

[11] Patent Number: 4,677,625
[45] Date of Patent: Jun. 30, 1987

[54] DISTRIBUTED TRELLIS ENCODER

[75] Inventors: William L. Betts, St. Petersburg; Kenneth Martinez, Pinellas Park; Gordon Bremer, Clearwater, all of Fla.

[73] Assignee: Paradyne Corporation, Largo, Fla.

[21] Appl. No.: 707,084

[22] Filed: Mar. 1, 1985

[51] Int. Cl.[4] .................... G06F 11/10; H03M 13/22
[52] U.S. Cl. ............................ 371/43; 340/347 DD;
371/2; 375/26; 375/39
[58] Field of Search ............ 340/347 DD; 371/43–45,
371/2; 360/39–42; 375/25, 34, 39

[56] References Cited

U.S. PATENT DOCUMENTS

| | | | |
|---|---|---|---|
| 4,087,787 | 5/1978 | Acampora | 371/43 |
| 4,240,156 | 12/1980 | Doland | 371/43 |
| 4,500,994 | 2/1985 | McCallister et al. | 371/43 |
| 4,536,878 | 8/1985 | Rattlingourd et al. | 371/43 |

Primary Examiner—T. J. Sloyan
Attorney, Agent, or Firm—Kane, Dalsimer, Sullivan, Kurucz

[57] ABSTRACT

In the transmitter of a data communication system using QAM, a plurality of trellis coders with delay units are used for forward error correction. The output of each encoder is modulated using QAM to generate sequential baud signal elements. The redundant data bits generated are distributed between several non-consecutive bauds. Likewise, at the receiver a plurality of distributed convolutional decoders are utilized to decode the received signal element. The distributed trellis decoder is self-synchronizing.

11 Claims, 4 Drawing Figures

DISTRIBUTED TRELLIS ENCODER

RELATED APPLICATIONS

The subject matter of this application is related to U.S. applications Ser. No. 707,085 entitled Self-Synchronizing Interleaver for Trellis Encoder used in Wireline Modems and Ser. No. 707,083 entitled Self-Synchronizing De-Interleaver for Viterbi Decoder Used in Wireline Modems, filed on even date herewith and incorporated herein by reference.

BACKGROUND OF THE INVENTION

1. Field of Invention

This invention pertains to an apparatus and method of encoding binary bits and more particularly to a method and apparatus for making use of a forward error correction scheme for a reduced number of errors at a given signal-to-noise ratio.

2. Description of the Prior Art

Communication networks using high speed data rates require high signal-to-noise ratios for proper data transmission. Numerous schemes and combinations thereof have been proposed to reduce the number of errors at these given signal-to-noise ratios. For example, in U.S. Pat. No. 4,077,021 to Csajka et al a forward error correcting scheme is described making use of the so-called Viterbi algorithm. In a further development described by the CCITT study group XVII, Contribution No. D180, in October, 1983, entitled TRELLIS-CODED MODULATION SCHEME WITH 8-STATE SYSTEMATIC ENCODER AND 90 SYMMETRY FOR USE IN DATA MODEMS TRANSMITTING 3-7 BITS PER MODULATION INTERVAL a two-dimensional trellis for a quadrature amplitude modulation scheme is disclosed having 90° symmetry which results in a 4db gain in the signal-to-noise ratio. Typically, in forward error coding, redundant bits are added systematically to the data bits so that normally only predetermined transitions from one sequential group of bits (corresponding to bauds) to another are allowed. There is an inherent correlation between these redundant bits over consecutive bauds. At the receiver each baud is tentatively decoded and then analyzed based on past history, and the decoded bits are corrected if necessary. However, it was found that certain types of relatively long error signals, such as for exmaple, low frequency phase jitter, cause a constant phase error in the signal constellation for extended (consecutive baud) periods of time. This type of error prevents or inhibits the correction of the received bits using the schemes described above.

OBJECTIVES AND SUMMARY OF THE INVENTION

A principal objective of the present invention is to provide a device and method for data communication in which the effects of long bursts of error signals such as low frequency phase jitter are minimized.

A further objective is to provide a method of adapting a standard modem to perform the subject method and to provide a method that is self-synchronizing.

Other objectives and advantages of the invention shall become apparent from the following description of the invention.

In the present invention the correlation of the redundant bits of different baud signals is distributed in time prior to encoding at the transmitter. A distributed trellis encoding scheme is used to obtain the redundant bits. At the receiver the received bauds are decoded using a plurality of distributed decoders which extract samples from multiple bauds for trellis decoding. The result is similar to that achieved by interleaving but avoids synchronization problems associated with the conventional complex interleaving processes.

DETAILED DESCRIPTION OF THE INVENTION

Figure 1:
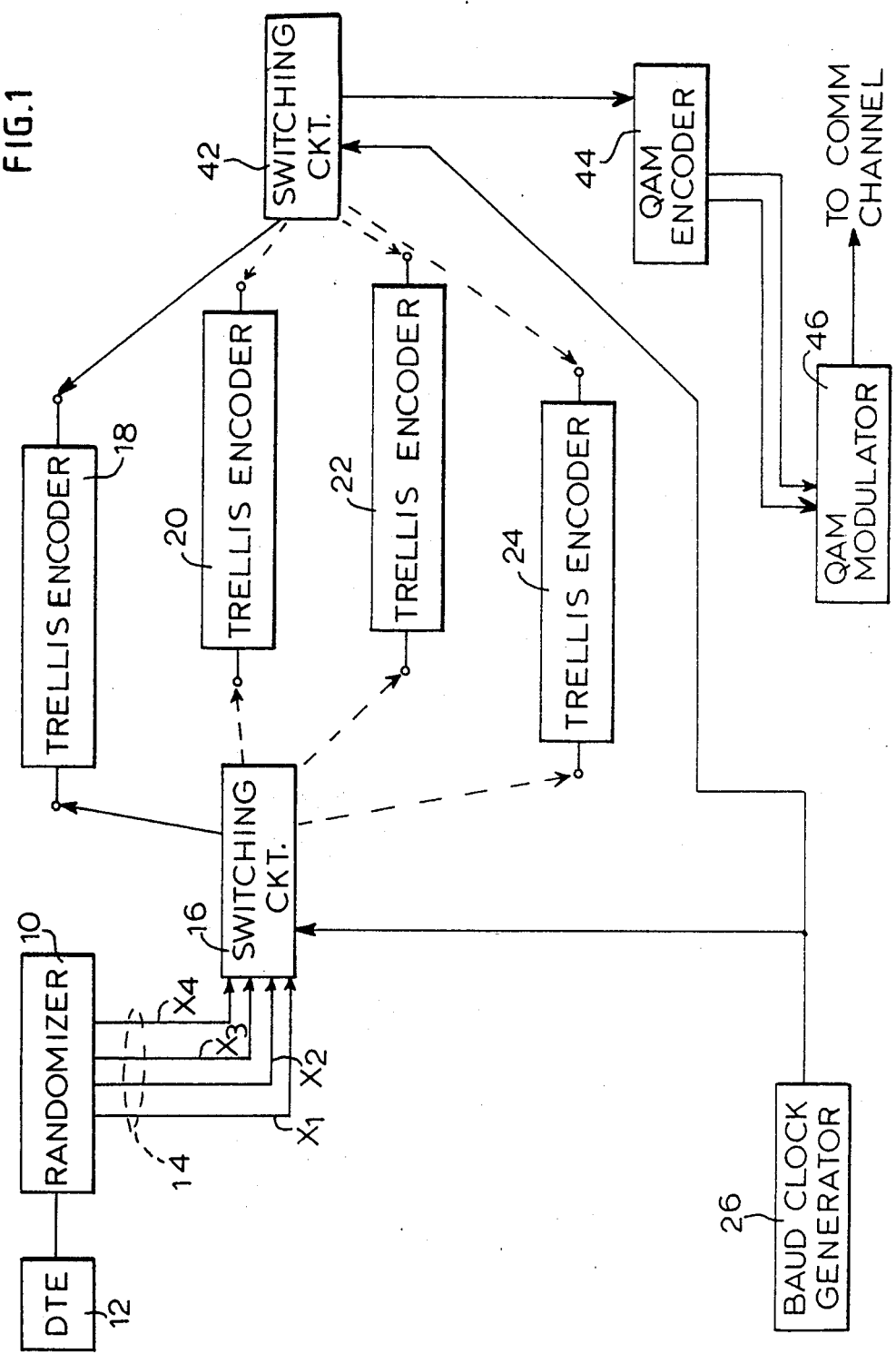
FIG. 1 shows the elements of a data transmitter constructed in accordance with the invention.

As shown in FIG. 1, a transmitter according to this invention comprises a randomizer 10 which receives serially a stream of data bits from DTE 12. The randomizer scrambles the bits in a preselected pattern and generates randomized bits on parallel output lines 14 identified as X1, X2, X3 and X4.

These output lines are fed by an electronic switching circuit 16 to a plurality of identical trellis encoders 18, 20, 22 and 24.

The electronic switching circuit 16 switches the signals from the randomizer 10 to one of the trellis encoders 18, 20, 22 and 24, in accordance with a baud clock signal generated by baud clock generator 26. In other words, for each baud period all the randomizer outputs X1, X2, X3 and X4 are fed to one of the encoders. Details of the trellis encoders 18, 20, 22 and 24 are shown in FIG. 2.

Each encoder comprises three delay units 28, 30 and 32 which are adapted to generate a delay of one baud period. The encoder further comprises three gates 34, 36 and 38. These gates may be for example XOR (exclusive -OR) gates.

Figure 2:
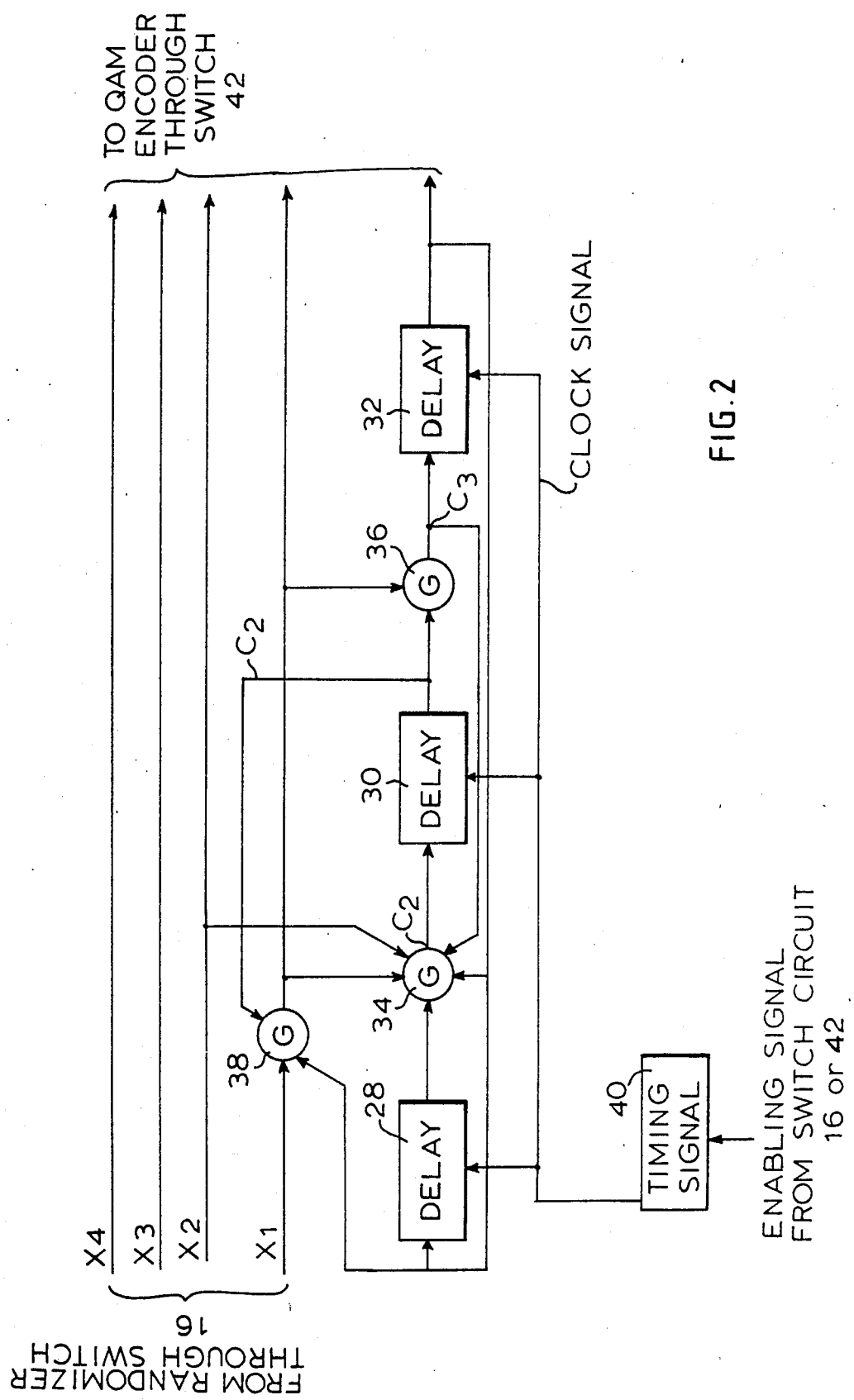
FIG. 2 shows the elements of a distributed trellis encoder.

The trellis encoder shown in FIG. 2 is well known in the art and need not be described any further. Preferably all the elements of the encoder are digital elements which are enabled by appropriate clocking signals from timing signal generator 40. The timing signal generator is enabled only when it receives an appropriate signal from switching circuit 16. Thus each encoder is active only when it is addressed by switching circuit 16. At all other times, the trellis encoders are idle.

Outputs Y0, Y1, X2, X3 and X4 are fed from the respective trellis encoders by a second electronic switching circuit 42 to QAM (quadrature amplitude modulation) encoder 44. Switching circuit 42 is also enabled by baud clock generator 26 so that it operates simultaneously with switching circuit 16. QAM encoder 44 selects a point of a preselected signal constellation corresponding to the inputs from circuit 42 and generates an in-phase and a quadrature output signal corresponding to said point. These output signals are fed to a QAM modulator 46 which generates corresponding analog QAM signals having a baud period equal to the period of the signals generated by signal generator 26. The signals from modulator 46 are transmitted over a common data communication channel to a receiver.

In effect the bits of several consecutive signals are spaced out over several bauds by the distributed trellis encoders.

Figure 3:
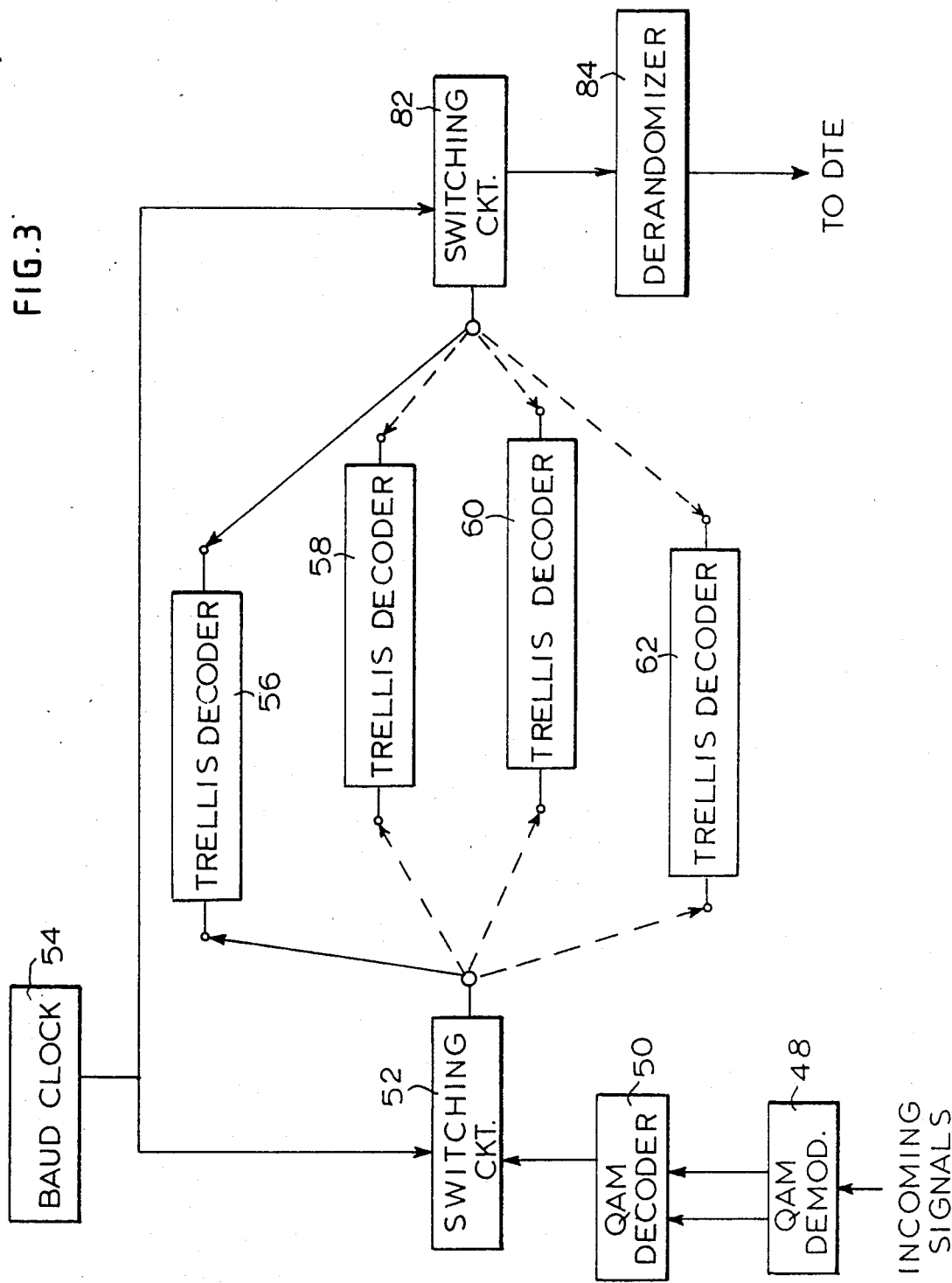
FIG. 3 shows the elements of a receiver for receiving data from the transmitter of FIG. 1.
Figure 4:
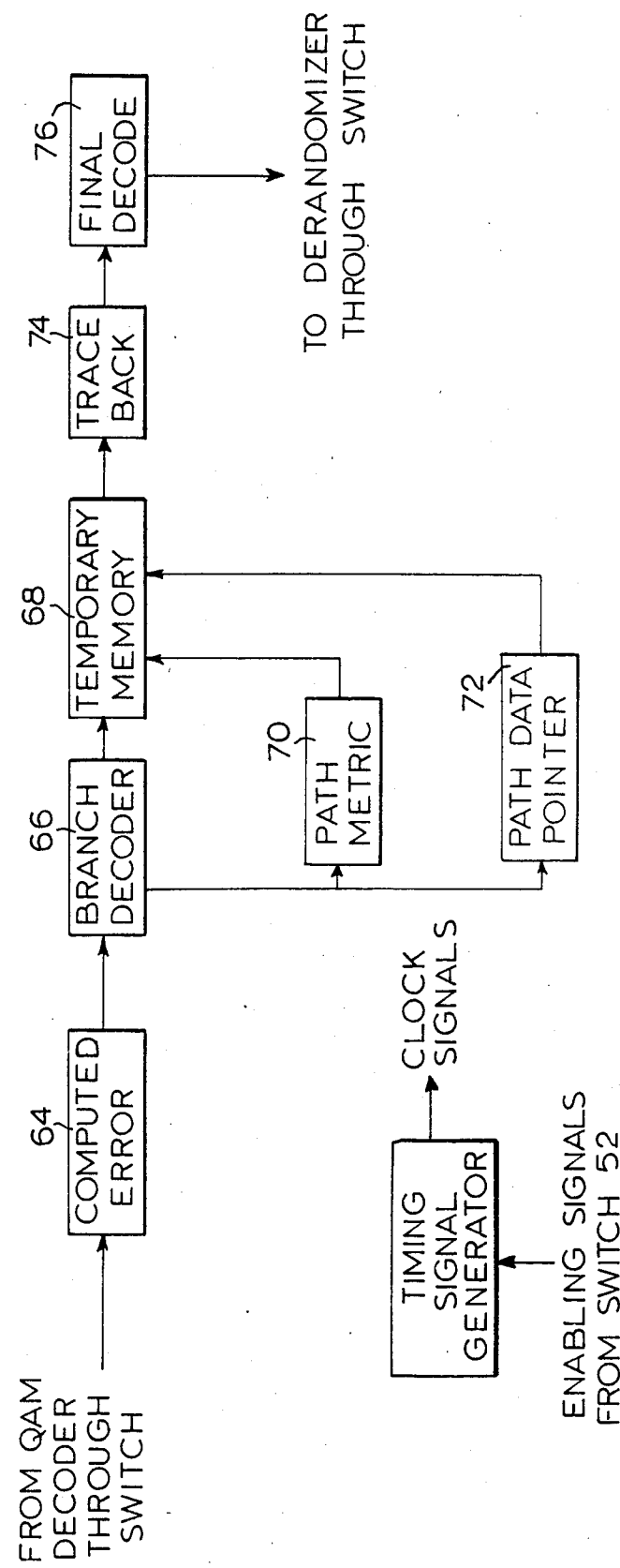
FIG. 4 shows the elements of a distributed trellis decoder.

At the receiver, illustrated in FIG. 3, the incoming analog signals are demodulated by a QAM demodulator 48 which generates an in-phase and a quadrature signal which are fed to a QAM decoder 50. The QAM decoder 50 selects a point on the signal constellation closest to the actual point corresponding to the signals received from QAM demodulator 48. The bits corresponding to said point are sent to a third electronic switching circuit 52 having a period equal to the baud period of the received signals. Circuit 52 accesses sequentially one of four distributed trellis decoders 56, 58, 60 and 62 in response to the switching signal from generator 54. Thus all the binary signals from QAM decoder 50 corresponding to each received QAM signal are sent to one of the trellis decoders. The four trellis decoders are standard decoders well known in the art. One such decoder is shown in FIG. 4.

In a typical trellis decoder, the signals from the QAM decoder (in the present case, via switching circuit 52) are fed into an error computer circuit 64 which generates an error signal based on previously received signals. This error signal is fed to a branch decoder 66. The branch decoder uses the trellis branch rules (predetermined in accordance with the Viterbi algorithm) to generate a set of possible points corresponding to the received point. These set of points are stored in temporary memory 68. The decoder then searches through the points of the set to calculate the point with the smallest errors in accordance with appropriate constants stored in the path metric memory 70 and path pointer memory 72. The smallest error is used by trace back memory 74 to track back the last 4-16 bauds (in accordance with a preselected well-known scheme) to generate the final received point. The final received point of the set of points in memory 68 is fed to final decoder 76 as the received point.

As with the encoder of FIG. 2, each decoder comprises digital elements which are enabled by a timing signal generator 78.

The timing signal generator is enabled by an appropriate signal from switching circuit 52 only when the respective decoder is addressed by the switching circuit. Generator 78 generates clocking signals for the various decoder elements. Thus each decoder 56, 68, 60 and 62 is active only when it is addressed by switching circuit 52, and otherwise it is idle.

The output of each decoder is accessed sequentially by a fourth electronic switching circuit 82 which is synchronized by the baud clock generator 54 so that it is in step with switching circuit 52. In other words, each trellis decoder is accessed simultaneously by switch circuits 52 and 82. The switching circuit 82 feeds the signals from the decoders to derandomizer 84 for reversing the effects of randomizer 10 and then to a user DTE.

It can be seen from the above description that switching circuits 16 and 52 acts as multiplexers while switch circuits 42 and 82 act as demultiplexers. The effect of this switching is to interleave the data bits at the transmitter across four bauds, and deinterleave these bits at the receiver. Obviously the trellis encoders are self-synchronized so that no synchronizing signals are needed between the transmitter and receiver In the above description consecutive bits are interleaved across four bauds by using four distributed trellis encoders and decoders. Obviously if more encoders and decoders are used the number of bauds over which interleaving occurs increases.

It should be appreciated that the invention makes use of standard QAM encoders, modulators, decoders, demodulators and standard trellis encoders and decoders which are well known in the art. Furthermore, while baud clock generators 26 and 54 are described as separate elements, in practice they can be incorporated in the QAM modulator and demodulator respectively. All the circuits of FIGS. 1 and 3 may be implemented by using a digital microprocessor.

Obviously, numerous modifications to the subject application may be made without departing from the scope of the invention as defined in the appended claims.

What is claimed is:

1. A data transmission section for a modem coupled to a channel for sending data signals comprising:
   1. A plurality of trellis encoders, each trellis encoder having an input for receiving n plain text bits, each encoder being provided to interleave bits received by the encoder during a first baud period with bits received during more than two previous baud periods to generate n trellis encoded bits, k, being larger than one; in a single baud period, each trellis encoder having means for delaying at least some of said n plain text bits so that they may be outputted and combined with bits outputted from one or more other trellis encoders during single baud periods;
   2. encoder activating means for selectively activating only one of said trellis encoders for one baud period in a preselected sequence whereby bits received during a baud period i are interleaved with bits received during a baud period i-k;
   3. signal encoding means for converting encoded bits into signals suitable for transmission over said channel; and
   4. transmitter switching means for feeding n plain text bits per baud period to the activated trellis encoder and for sending the encoded bits from the activated trellis encoder to the signal encoding means.

2. A receiver section for a modem receiving data signals from a channel, said signals having been trellis encoded by interleaving bits corresponding to a baud period i with bits corresponding to a baud period i-k, k being larger than two, and having:
   1. a demodulator and a decoder connected to the output of said demodulator for converting analog data signals from said channel into multiple series of bits, each series of bits substantially corresponding to a point of said analog data signal's preselected signal constellation;
   2. k trellis decoders, each trellis decoder having an input from said decoder for receiving series of bits from said decoder and generating n bits of plain text bits corresponding to n bits received at least during two previous baud periods;
   3. decoder activating means for activating only one of said trellis decoders during one baud period in another predetermined sequence; and
   4. receiver switching means for feeding n encoded bits to the activated decoder and for collecting n plain text bits from the activated decoder.

3. A method of transmitting a plurality of input data bits over a channel by quadrature amplitude modulator comprising:

providing a plurality of trellis encoders, each encoder using an identical scheme to interleave bits received during a first baud period with bits received during more than two earlier baud periods preceding said first baud period to generate output bits;

activating each of said trellis encoders in a preselected order for a baud period;

feeding bits which occur during a single baud period to only one of said plurality of trellis encoders;

delaying at least some of said bits in said one trellis encoder during a single baud period;

combining bits which have been outputted from said one trellis encoder with bits which have been outputted from one or more different trellis encoders for transmission during a single baud period; and quadrature amplitude modulating output bits of each activated trellis encoder.

4. A system for transmitting data signals over a data channel comprising:
  a. a data transmission section coupled to said channel for sending data signals and having:
    1. A plurality of trellis encoders, each trellis encoder having an input for receiving n plain text bits each encoder being provided to combine bits received by the encoder during more than two previous baud periods with bits received during a previous baud period to generate n trellis encoded bits in a single baud period, each trellis encoder having means for delaying at least some of said n plain text bits so that they can be outputted and combined with bits outputted from one or more other trellis encoders during single baud periods;
    2. encoder activating means for selectively activating only one of said trellis encoders for one baud period in a preselected sequence;
    3. signal encoding means for converting encoded bits into signals suitable for transmission over said channel; and
    4. transmitter switching means for feeding n plain text bits per baud period to the activated trellis encoder and for sending the encoded bits from the activated trellis encoder to the signal encoding means; and
  b. a receiver section for receiving data signals from said channel, and having:
    1. a demodulator and a decoder connected to the output of said demodulator for converting analog data signals from said channel into multiple series of bits, each series of bits substantially corresponding to a point of said analog data signal's preselected signal constellation of;
    2. a plurality of trellis decoders equal in number to the trellis encoders, each decoder generating n bits of plain text bits corresponding to n bits received by the encoder during a baud period and n bits received at least during a previous baud period;
    3. decoder activating means for activating only one of said trellis decoders during one baud period in another predetermined sequence; and
    4. receiver switching means for feeding n bits to the activated decoder and for collecting n plain text bits from the activated decoder.

5. The system of claim 4 wherein said transmitter switching means comprises a first transmitter switch for providing input bits to the activated trellis encoder, and a second transmitter switch for providing encoded bits from the activated trellis encoder to the signal encoding means.

6. The system of claim 5 wherein said signal encoding means comprises a quadrature amplitude modulator.

7. The system of claim 6 wherein said signal decoding means comprises a quadrature amplitude demodulator.

8. The system of claim 7 wherein there are k trellis encoders each trellis encoders including several delay elements for combining the bits received during said one baud periods with bits received during several preceding baud periods each preceding baud period being separated from the next baud period by $(k-1)$ D seconds where D is the duration of a period.

9. The system of claim 7 wherein said receiver switching means comprises a first receiver switch for feeding encoded bits to the activated decoders and a second receiver switch for collecting plain text bits from the activated decoders.

10. The system of claim 7 wherein each period has a time duration of D seconds and each encoder includes a delay element for delaying bits received during a baud period by D seconds.

11. The method of claim 3 further comprising providing a plurality of trellis decoders for sequentially decoding transmitted signals, each trellis decoder being activated sequentially for a baud period for deinterleaving said signals.

* * * * *